(12) United States Patent
Foust

(10) Patent No.: US 8,697,480 B1
(45) Date of Patent: Apr. 15, 2014

(54) METHOD FOR TREATING A SEMICONDUCTOR

(71) Applicant: General Electric Company, Schenectady, NY (US)

(72) Inventor: Donald Franklin Foust, Glenville, NY (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 13/682,876

(22) Filed: Nov. 21, 2012

(51) Int. Cl.
*H01L 21/00* (2006.01)

(52) U.S. Cl.
USPC .............. 438/84; 438/102; 257/E21.071

(58) Field of Classification Search
USPC .............. 438/61, 86, 548; 257/E27.122, 257/E27.124, E21.069, E21.07, E21.071
See application file for complete search history.

(56) References Cited

U.S. PATENT DOCUMENTS

| | | | |
|---|---|---|---|
| 4,297,232 | A | 10/1981 | Ruben |
| 4,873,354 | A | 10/1989 | Globus |
| 5,472,910 | A | 12/1995 | Johnson et al. |
| 5,843,408 | A | 12/1998 | Hattori et al. |
| 5,879,717 | A | 3/1999 | McConn-Stern et al. |
| 7,901,975 | B2 | 3/2011 | Chen |
| 2006/0102226 | A1 | 5/2006 | Kern et al. |
| 2011/0259423 | A1 | 10/2011 | Korevaar et al. |
| 2011/0259424 | A1 | 10/2011 | Basol |

FOREIGN PATENT DOCUMENTS

GB 2384621 A 7/2003

OTHER PUBLICATIONS

Rajavel et al., "Gas Source Iodine Doping and Characterization of Molecular—Beam Epitaxially Grown CdTe", Journal of Vacuum Science & Technology B: Microelectronics and Nanometer Structures, vol. 10, Issue 4, pp. 1432-1437, Jul./Aug. 1992.

Yasuda et al., "Growth Condition of Iodine-doped n+-CdTe Layers in Metal-Organic Vapor Phase Epitaxy", Journal of Electronic Materials, vol. 31, Issue 7, pp. 785-790, 2002.

Lee et al., "Processing Additives for Improved Efficiency from Bulk Heterojunction Solar Cells", Journal of the American Chemical Society, vol. 130, Issue 11, pp. 3619-3623, 2008.

Tsai et al., "Enhanced Photoelectrochemical Performance of Dye-Sensitized Solar Cells base on Iodine-PEDOT Composited Film", International Journal of Electrochemical Science, vol. 6, pp. 3938-3950, 2011.

Potlog et al., "Quantitative Comparison of Different Znse/Cdte Device Architectures for High Efficiency Photovoltaics", European Material Research Society, pp. 8 and 9 of 26, Symposium, May 17, 2012.

*Primary Examiner* — Cheung Lee
(74) *Attorney, Agent, or Firm* — MacMillan, Sobanski & Todd, LLC

(57) ABSTRACT

Methods for treating a semiconductor material, and for making devices containing a semiconducting material, are presented. One embodiment is a method for treating a semiconductor material that includes a chalcogenide. The method comprises contacting at least a portion of the semiconductor material with a chemical agent. The chemical agent comprises a solvent, and an iodophor dissolved in the solvent.

29 Claims, 1 Drawing Sheet

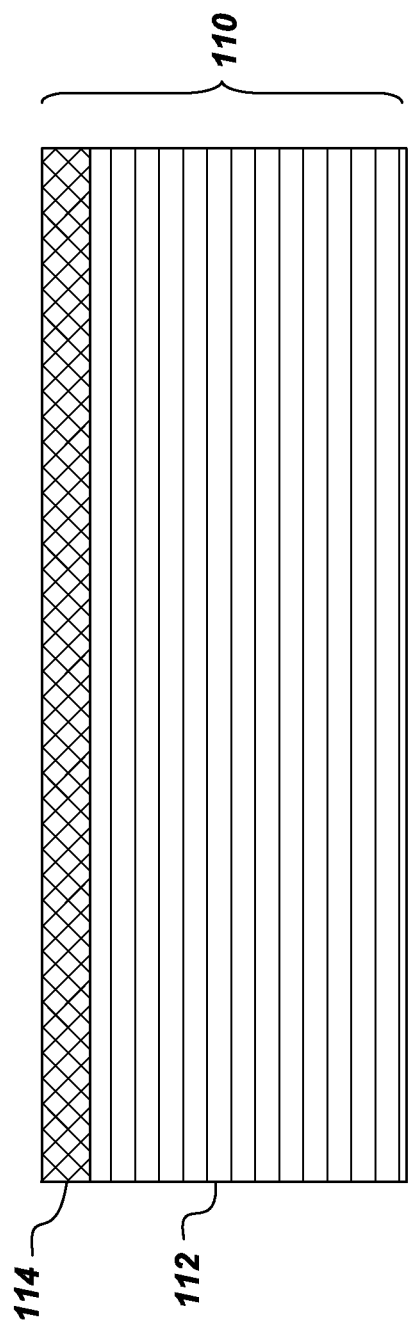

METHOD FOR TREATING A SEMICONDUCTOR

BACKGROUND

The invention generally relates to methods for treating a semiconductor material. More particularly, the invention relates to methods for treating a semiconductor layer used in thin-film photovoltaic devices.

Thin film photovoltaic devices typically include a plurality of semiconductor layers disposed on a transparent substrate, wherein a first semiconductor layer serves as a window layer and a second semiconductor layer serves as an absorber layer. The window layer allows the penetration of solar radiation to the absorber layer, where the optical energy is converted to usable electrical energy. In certain configurations, thin film photovoltaic devices may further include an additional semiconductor layer interposed between the window layer and the absorber layer that may function as an intrinsic layer. Cadmium telluride/cadmium sulfide (CdTe/CdS) heterojunction-based photovoltaic devices are one such example of thin film solar cells, where a cadmium telluride (CdTe)-based semiconductor layer may function as an intrinsic layer or an absorber layer.

However, CdTe-based photovoltaic devices typically demonstrate relatively low power conversion efficiencies, which may be attributed to a relatively low open circuit voltage (Voc) in relation to the band gap of the material which is due, in part, to the low effective carrier concentration and short minority carrier lifetime in CdTe. Effective carrier concentration of CdTe may be improved by doping with p-type dopants.

Further issues with improving the device efficiency of CdTe solar cells include the high work function of CdTe and high back-contact resistance at the interface between CdTe and metal-based back contact layer. The back-contact resistance may be improved by increasing the carrier concentration at the back interface. For example, for a p-type CdTe material, increasing the carrier concentration amounts to increasing the p-type carriers in the CdTe material to form an "ohmic contact layer" on the backside of the CdTe layer, which is in contact with the back contact layer.

Typical methods employed to form the ohmic layers or for doping the absorber layer include etching of the CdTe layers and incorporation of copper into back-end of line processing of the absorber layer. However, it may be difficult to control the amount of copper incorporated in the bulk and in the back interface, using a typical CdTe processing method. Further, photovoltaic devices manufactured using the typical methods may include a high copper content at the back-interface, which may adversely affect the long-term stability. Furthermore, etching of the CdTe layer using conventional etching agents may lead to removal of CdTe material from the surface, and selective etching of grain boundaries, resulting in increased defects.

Thus, there is a need for improved methods of processing semiconductor layers. Further, there is a need for improved photovoltaic device configurations including the semiconductor layers.

BRIEF DESCRIPTION OF THE INVENTION

Embodiments of the present invention are provided to meet these and other needs. One embodiment is a method for treating a semiconductor material that includes a chalcogenide. The method comprises contacting at least a portion of the semiconductor material with a chemical agent. The chemical agent comprises a solvent, and an iodophor dissolved in the solvent.

Another embodiment is a method for treating a semiconductor material, comprising (a) contacting at least a portion of the semiconductor material with a passivating agent, wherein the semiconductor material comprises a chalcogenide; (b) forming a first region in the semiconductor material by introducing a dopant into the semiconductor material; (c) forming a chalcogen-rich region; and (d) forming a second region in the semiconductor material, the second region comprising a dopant, wherein an average atomic concentration of the dopant in the second region is greater than an average atomic concentration of the dopant in the first region. Step (c) comprises contacting at least a portion of the semiconductor material with a chemical agent, wherein the chemical agent comprises a solvent and an iodophor dissolved in the solvent.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein the FIGURE is a schematic cross section of a semiconductor material used in embodiments of the present invention.

DETAILED DESCRIPTION

Some of the embodiments of the invention include methods for treating a semiconductor layer. More particularly, the invention relates to methods for treating a semiconductor layer used in thin-film photovoltaic devices.

As noted earlier, the conventional methods of making photovoltaic devices typically include etching and introduction of copper at the back-end line processing. However, it may be difficult to control the amount of copper incorporated in the bulk and in the back interface, using a typical CdTe processing method. Further, photovoltaic devices manufactured using the typical methods may include a high copper content at the back-interface, which may adversely affect the long-term stability. Furthermore, etching may lead to grain boundary modification and electrical shunting. Embodiments of the invention described herein address the noted shortcomings of the state of the art. Embodiments of the present invention advantageously provide for efficient and stable photovoltaic devices, and methods of making these.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The terms "transparent region" and "transparent layer" as used herein, refer to a region or a layer that allows an average transmission of at least 70% of incident electromagnetic radiation having a wavelength in a range from about 300 nm to about 850 nm. As used herein, the term "disposed on" refers to layers disposed directly in contact with each other or indirectly by having intervening layers therebetween, unless otherwise specifically indicated.

The terms "contacting" or "contacted" as used herein means that at least a portion of the semiconductor layer is exposed to, such as, in direct physical contact with a suitable contacting material, such as, for example, a passivating agent, a chemical agent, a dopant source, a contacting composition, a metal salt, or combinations thereof. In some embodiments, a surface of the semiconductor layer may be contacted with the suitable contacting material, for example using a surface treatment technique. In some other embodiments, a substantial portion of the semiconductor layer may be contacting with a suitable contacting material, for example, using an immersion treatment.

In the specification, drawings, and in the claims, the embodiments related to the methods are not limited by a particular sequence of steps, unless the context clearly indicates otherwise. Thus, in some embodiments, two or more of the steps of a method may be performed simultaneously. Alternatively, in some other embodiments, two or more of the steps of a method may be performed sequentially. Further, in the following specification, drawings, and in the claims, the embodiments related to the methods are not limited to the order of appearance of the steps in the claims, drawings, or in the specification. Thus, by way of example, in embodiments including steps (a), (b), and (c), the step (c) may be performed simultaneously with, prior to, or after the step (b). Further, in some embodiments, step (a) may be performed after step (b) or after step (c). In some other embodiments, all the three steps (a), (b), and (c) may be performed simultaneously.

As discussed in detail below, some embodiments of the invention are directed to methods for treating a semiconductor material including a chalcogenide material. The semiconductor material may be in the form of a layer of semiconductor material that may be disposed on one or more other layers. In some embodiments, the semiconductor material is a component of a photovoltaic device, such as a thin film photovoltaic device having multiple layers. In some embodiments, the semiconductor material serves as an absorber layer in the photovoltaic device. The term "absorber layer" as used herein refers to a semiconducting layer wherein the solar radiation is absorbed and generates electron-hole pairs.

The term "chalcogenide" as used herein refers to a compound of at least one chalcogen and at least one electropositive element. The term "chalcogen" refers to tellurium, selenium, or sulfur. Suitable chalcogenide materials include cadmium telluride, magnesium telluride, mercury telluride, lead telluride, zinc telluride, cadmium selenide, mercury selenide, lead selenide, zinc selenide, cadmium sulfide, mercury sulfide, zinc sulfide, lead sulfide, cadmium selenide telluride, cadmium zinc telluride, cadmium sulfur telluride, cadmium manganese telluride, cadmium magnesium telluride, or combinations thereof. The above-mentioned semiconductor materials may be used alone or in combination. Further, these materials may be present in more than one layer, each layer having different type of semiconductor material or having combinations of the materials in separate layers. In certain embodiments, the semiconductor material includes cadmium telluride (CdTe). In certain embodiments, the semiconductor material includes p-type cadmium telluride (CdTe).

Improved methods for processing such materials are presented in commonly owned U.S. patent application Ser. No. 13/601,110, filed 31 Aug. 2012. In certain embodiments described therein, a semiconductor material is treated with a chemical agent comprising iodine. The iodine-containing chemical agent is used to react with the semiconductor material to form a chalcogen-rich region (such as a tellurium-rich region in CdTe material) which promotes the formation of a stable, efficient ohmic contact in photovoltaic devices. The chemical agent is formulated to provide an effective quantity of elemental iodine in contact with the semiconductor material to enable the formation of the chalcogen-rich region. However, maintaining consistent results when working with iodine formulations presents several challenges. Processes in which the semiconductor material is immersed in a solution of dissolved iodine are potentially subject to control issues due to contaminants and reaction byproducts entering the solution, while iodine concentration tends to continually decrease due to volatilization and consumption. Application of aqueous iodine to a surface of semiconductor material such as CdTe results in a change in the surface wetting properties of the CdTe, and the aqueous iodine no longer adheres to the CdTe surface, preventing consistent and uniform formation of the enriched tellurium region. In addition, the chalcogen-enrichment reaction often is performed at elevated temperatures. Applying thin films of aqueous iodine to a warmed CdTe surface, for example, results in volatilization of the iodine prior to completion of the tellurium-enrichment reaction.

Embodiments presented herein employ improved chemical agent compositions with enhanced iodine stability (that is, lower susceptibility to iodine volatilization) and/or enhanced iodine solubility. These embodiments enjoy comparable performance to those employing aqueous immersion techniques for applying the chemical agent, with added advantages of improved process consistency and ease of maintenance.

In one embodiment, a method for treating a semiconducting material is provided, in which a semiconducting material comprising a chalcogenide is contacted with a chemical agent. In particular embodiments, the chemical agent is applied to the semiconducting material for the purpose of forming a chalcogen-rich region within the semiconducting material. For example, where the semiconducting material comprises tellurium, as in cadmium telluride materials, the chemical agent is applied to react with the telluride compound to form a tellurium-rich region.

The term "chalcogen-rich region" as used herein refers to a region having an average atomic concentration of chalcogen greater than an average atomic concentration of the chalcogen in the bulk region (that is, the region that is unaffected by contact with the chemical agent) of the semiconductor material. In some embodiments, the semiconductor material includes tellurium, and the application of the chemical agent is performed to form a tellurium-rich region in the semiconductor material. The term "tellurium-rich region" as used herein refers to a region having an average atomic concentration of tellurium greater than a bulk region of the semiconductor material. In some embodiments, a ratio of the average atomic concentration of tellurium in the tellurium-rich region to the average atomic concentration of tellurium in the bulk region of the semiconductor material is greater than about 1.2. In some embodiments, a ratio of the average atomic concentration of tellurium in the tellurium-rich region to the average atomic concentration of tellurium in the bulk region of the semiconductor material is greater than about 2.

In some embodiments, the tellurium-rich region may be further characterized by an average atomic ratio of tellurium to cadmium. In some embodiments, the tellurium-rich region has an average atomic ratio of tellurium to cadmium in a range greater than about 2. In some embodiments, the tellurium-rich region has an average atomic ratio of tellurium to cadmium in a range greater than about 10. In some embodiments, the tellurium-rich region has an average atomic ratio of tellurium to cadmium in a range greater than about 40. The term "atomic ratio" as used herein refers to a ratio of average atomic concentrations.

The chalcogen-rich region may be further characterized by its thickness. In some embodiments, the chalcogen-rich region has a thickness in a range greater than about 10 nanometers. In some embodiments, the chalcogen-rich region has a thickness in a range from about 10 nanometers to about 1000 nanometers. In some embodiments, the chalcogen-rich region has a thickness in a range from about 50 nanometers to about 500 nanometers. In some embodiments, the methods of the present invention may advantageously provide for a deeper chalcogen-rich region when compared to chalcogen-rich region formed using conventional etching chemical agents.

The chemical agent applied in the present embodiments includes a solvent and an iodine complex ("iodophor") dissolved in the solvent. An iodophor is a complex formed between elemental iodine and an iodophor-forming solubilizing agent. The chemical agent, in one embodiment, is the product of mixing the solvent, elemental iodine, and a suitable iodophor-forming solubilizing agent; upon mixing, the elemental iodine will form the iodophor complex with the solubilizing agent. It should be noted that in some instances, the solvent itself forms an iodophor in the presence of elemental iodine, and thus the solvent can be considered both the "solvent" component and the "solubilizing agent" mentioned above; thus it may not be necessary in all instances to mix three distinct components to form the chemical agent described herein. Without being bound by any particular theory, it is believed that the iodophor reduces the volatility of iodine in the agent and serves as a soluble reservoir for elemental iodine, releasing a controlled amount of elemental iodine into the agent as the iodine is removed during use and/or storage of the chemical agent. Experiments comparing the efficacy of chemical agents comprising soluble iodide compounds vs. agents comprising dissolved elemental iodine suggest that elemental iodine is far more effective than iodide in producing an effective chalcogen-rich region in the semiconducting materials of interest. Examples of iodophors include polyvinyl pyrrolidone (also known as PVP, or povidone):iodine, polyethoxy polypropoxyethanol:iodine, and the nonyl phenyl ether of polyethylene glycol:iodine. Iodophors are also formed when iodine is dissolved in ethylene glycol, propylene glycol, glycerin, and some other organic solvents, and thus further examples of iodophors may include ethylene glycol:iodine, propylene glycol:iodine, and glycerin:iodine.

The solvent used in the chemical agent may be an organic solvent. In some embodiments, the solvent further exhibits solubility in water and has a boiling point greater than about 100 degrees Celsius, and in particular embodiments, the boiling point is greater than about 150 degrees Celsius. The solvent may include, for example, ethylene glycol, propylene glycol, glycerol, or combinations thereof. The use of such organic solvents may enhance wetting on semiconductor materials such as CdTe relative to aqueous solutions, may (as noted above) promote the formation of iodophors, and may have higher solubility for elemental iodine relative to water.

Elemental iodine may be added to form the chemical agent by introduction of any convenient source, such as solid elemental iodine, solutions of iodine in aqueous potassium iodide solution, or by providing any other convenient source of elemental iodine. The iodine complexes with any suitable present solubilizing agent to form the iodophor described above. Thus the "total iodine" content of the chemical agent is defined herein to be the sum of the amount of iodine that is present in the iodophor ("complexed iodine") plus the amount of elemental iodine dissolved in the chemical agent but not present in a complex ("free iodine"). Free iodine in the chemical agent may be present (1) in the amount dictated by chemical equilibrium with the iodophor in the agent, and, if applicable, (2) due to an excess of elemental iodine beyond what is taken up by available solubilizing agent. In some embodiments, the total iodine in the chemical agent is present at a concentration of at least about 0.1 g/L (0.01 weight %), and in certain embodiments the concentration is at least about 1 g/L (0.1 weight %). For example, in some embodiments the concentration of total iodine in the chemical agent is in a range from about 0.01 weight % to about 1 weight %.

The chemical agent described herein may be applied in the form of a liquid or as a paste. In some embodiments, the chemical agent further includes a thickener to increase the viscosity of the agent to provide the desired consistency, which may vary depending on the processing conditions. The type and amount of thickener added to the chemical agent readily may be determined by the desired consistency for a given process. In some embodiments, the thickener includes an inorganic material, such as particles of aluminum oxide, fumed silica, or other similar materials. Organic materials may also be used as the thickener, either in addition to, or in place of, the inorganic thickener. Examples of suitable organic thickeners include polymeric materials (such as derivatives of cellulose), polyvinyl pyrrolidone, and polyvinyl alcohol.

Whether applied as a paste or as a liquid, by immersion or by application of a layer on the surface of the semiconductor material, the contacting of the semiconductor material with the chemical agent is performed at a temperature and for a time suitable to form the desired region of chalcogen enrichment. Thus, in some embodiments, the method includes heating the semiconductor material to a temperature of at least about 45 degrees Celsius, and in particular embodiments the temperature is at least about 65 degrees Celsius. The selection of time for the process may vary, depending in part on the temperature and desired level of reaction. In some embodiments, the time is at least about 2 minutes, and in particular embodiments, at least about 5 minutes. In some embodiments, the time is up to about 20 minutes, and in particular embodiments, up to about 15 minutes. For example, in one embodiment, the time is in a range from about 5 minutes to about 10 minutes. One example of a time and temperature combination is 5-10 minutes at a temperature of about 65 degrees Celsius.

Upon reaching the desired time for contacting the semiconducting material with the chemical agent, the chemical agent is then removed from contact with the semiconducting material. Removal may be done by any technique suitable to remove the chemical agent, and any byproducts of its reaction with the semiconductor material, from contact with the surface of the semiconductor material. One example of such techniques is rinsing with a suitable medium such as water or other solvent.

The semiconductor material may be processed to incorporate one or more dopants before, during, and/or after contacting the semiconductor material with the chemical agent. The term "dopant" as used herein refers to a species added to the semiconductor material to alter one or more properties, such as, for example, electrical properties. Examples of such dopants include copper, silver, and gold. In one embodiment, a dopant is introduced into the semiconductor material to form a first region in the semiconductor material, where the first region comprises the dopant. In some embodiments, a second region is formed in the semiconductor material, where an average atomic concentration of the dopant in the second region is greater than an average atomic concentration of the dopant in the first region. These steps may be carried out simultaneously with contacting the semiconducting material with the chemical agent, or in any convenient sequence.

In certain embodiments, the formation of the first and/or second regions is accomplished by contacting the semiconductor material with a contacting composition that includes the desired dopant. The contacting composition may be in any form used in the art to introduce dopants into semiconducting materials, including solids, liquid solutions or suspensions, pastes, vapors, or combinations of these. In some embodiments, the contacting composition is a liquid solution of dopant in a solvent, such as a metal salt solution. In some embodiments, dopant may be present in the contacting composition solution at a concentration less than about 10 parts per million. In some embodiments, the dopant is present in the contacting composition solution at a concentration in a range from about 10 parts per billion to about 1000 parts per billion. In some embodiments, the dopant is present in the contacting composition solution at a concentration in a range from about 100 parts per billion to about 500 parts per billion. In particular embodiments, the dopant includes copper.

The contacting composition solution described above used for forming the first and/or second regions may be applied to the semiconductor material by any suitable method, such as by spraying or immersion. In some embodiments, the semiconductor material may be contacted with the contacting composition solution at a temperature in the range from about 25 degrees Celsius to about 100 degrees Celsius, and in particular embodiments, the temperature is in a range from about 60 degrees Celsius to about 75 degrees Celsius. The time, in some embodiments, for which contact with the solution may be maintained is in the range from about 1 minute to about 30 minutes, and in particular embodiments is in the range from about 2 minutes to about 10 minutes. After removing the solution from the semiconductor material, the semiconductor material may be further subjected to a heat treatment to assist in the incorporation of the dopant into the semiconductor material.

In some embodiments, an average atomic concentration of the dopant in the second region formed in the techniques described above is greater than about $5\times10^{18}$ atoms/cm$^3$. In some embodiments, an average atomic concentration of the dopant in the second region is in a range greater than about $1\times10^{19}$ atoms/cm$^3$. In some embodiments, an average atomic concentration of the dopant in the second region is in a range from about $5\times10^{18}$ atoms/cm$^3$ to about $1\times10^{20}$ atoms/cm$^3$.

As noted earlier, an average atomic concentration of the dopant in the second region is greater than an average atomic concentration of the dopant in the first region. In some embodiments, a ratio of the average atomic concentration of the dopant in the second region to the average atomic concentration of the dopant in the first region is greater than about 5. In some embodiments, a ratio of the average atomic concentration of the dopant in the second region to the average atomic concentration of the dopant in the first region is greater than about 10. In some embodiments, a ratio of the average atomic concentration of the dopant in the second region to the average atomic concentration of the dopant in the first region is greater than about 50.

As noted above, the formation of first and/or second regions described above, that is, the introduction of dopants into the semiconductor material, may be performed in a step or series of steps that is separate from the application of the chemical agent. In one such embodiment, the chemical agent is substantially free of dopant, meaning that the concentrations of dopants such as copper, silver, or gold in the chemical agent are below about 10 parts per billion. In particular embodiments, the chemical agent is substantially free of copper. In some embodiments the chemical agent is removed from contact with the semiconductor material, and then a dopant is introduced into the semiconductor material. The dopant may be introduced, for example, by contacting at least a portion of the semiconductor material with a contacting composition comprising a dopant, such as copper, silver, or gold.

In other embodiments, the chemical agent and a source of dopant may be applied simultaneously; in these embodiments, the chemical agent further comprises a dopant, such as by the addition of a metal compound that is soluble in the chemical agent. In such embodiments, then, the chemical agent and the contacting composition may be merged or mixed together, with one composition performing the function of multiple agents. Thus during the contacting step described previously, dopants such as copper, silver, or gold, for example, may be introduced simultaneously with the formation of the chalcogen-rich region. In some embodiments, dopant may be present in the chemical agent at a concentration less than about 10 parts per million. In some embodiments, the dopant is present in the chemical agent at a concentration in a range from about 10 parts per billion to about 1000 parts per billion. In some embodiments, the dopant is present in the chemical agent at a concentration in a range from about 100 parts per billion to about 500 parts per billion. In particular embodiments, the dopant includes copper.

In some embodiments, the method includes contacting at least a portion of the semiconductor material with a passivating agent. As with the steps described previously, this step may be performed sequentially before or after any of the other described steps, or it may be combined with one or more steps and performed simultaneously with the step or steps with which it was combined. The term "passivating agent" as used herein refers to an agent capable of altering the physical or compositional characteristics of the semiconductor layer resulting in improved device performance. In some embodiments, the passivating agent may allow for removing defect states along the grain boundaries. In some embodiments, for example, the passivating agent may allow for diffusion between the CdS and CdTe layers in CdS/CdTe-based photovoltaic devices, thus enabling an improved interface. In some embodiments, the passivating agent includes cadmium chloride (CdCl2). In some embodiments, the method may include contacting at least a portion of the semiconductor material with cadmium chloride or a cadmium chloride source. In some embodiments, a portion of the semiconductor material may be treated with a solution of CdCl2. In some embodiments, a portion of the semiconductor material may be treated with $CdCl_2$ vapor.

In some embodiments, the step of contacting at least a portion of the semiconductor material with a passivating agent further includes a heat treatment. In some embodiments, the heat treatment step may be performed subsequent to the step of contacting at least a portion of the semiconductor material with the passivating agent. In some embodiments, the heat treatment step may be performed simultaneously with the step of contacting at least a portion of the semiconductor material with the passivating agent.

In some embodiments, the heat treatment step is performed at a temperature within a range from about 300° C. to about 500° C. In some embodiments, the heat treatment step is performed at a temperature within a range from about 350° C. to about 450° C. In some embodiments, the heat treatment step is performed for a time duration within a range from about 1 minute to about 60 minutes. In some embodiments, the heat treatment step is performed for a time duration within a range from about 10 minutes to about 45 minutes. In some embodiments, the heat treatment step is performed in an inert environment. In some other embodiments, the heat treatment step is performed in an environment including an oxidizing environment. Non-limiting examples of oxidizing environments include air or oxygen.

In some embodiments, the method may further include contacting at least a portion of the semiconductor material with a cleaning agent, after the step of treating the semiconductor material with the passivating agent to remove any impurities, such as, for example, cadmium oxide from the surface. Suitable non-limiting examples of a cleaning agent include an aqueous solution of ethylene di-amine (EDA), ammonium hydroxide ($NH_4OH$), or combinations thereof.

Some embodiments of the present invention include combinations of the various steps described above. For example, with reference to the FIGURE, one embodiment is a method for treating a semiconductor material 110, wherein the semiconductor material 110 comprises a chalcogenide. The method includes (a) contacting at least a portion of the semiconductor material 110 with a passivating agent; (b) forming a first region 112 in the semiconductor material by introducing a dopant into the semiconductor material; (c) forming a chalcogen-rich region; and (d) forming a second region 114 in the semiconductor layer, the second region comprising a dopant, wherein an average atomic concentration of the dopant in the second region is greater than an average atomic concentration of the dopant in the first region. Step (c) includes contacting at least a portion of the semiconductor material with the chemical agent described previously herein, wherein the chemical agent comprises a solvent, elemental iodine, and an iodophor dissolved in the solvent.

In any of the embodiments described herein, the step of forming a second region 114 may further include forming a chalcogenide of the dopant species. In some embodiments, the step of forming a second region 114 may further include forming a telluride of the dopant species. In certain embodiments, the second region 114 may include copper telluride. In some embodiments, the chalcogen-rich region (not shown) includes the second region 114. In some other embodiments, the second region 114 includes the chalcogen-rich region. In some other embodiments, the chalcogen-rich region and the second region 114 are substantially overlapping. In some embodiments, such as embodiments where semiconductor material 110 is included as a layer in a photovoltaic device, first region 112 may function primarily as the absorber in the device, while second region 114 may function to promote ohmic contact for conducting current out of the device. It will be appreciated that other layers and materials, such as graphite and/or metallic materials, may be disposed over second region 114 to complete the formation of an electrode.

In some embodiments, a method for making a photovoltaic device is presented. The method includes disposing a chalcogen containing semiconductor material on a support, and processing the semiconductor material in accordance with any of the methods described above. In some embodiments, the semiconductor material is an absorber material comprising a chalcogenide as previously described. Methods for fabrication of thin-film photovoltaic devices in substrate or superstrate configurations are well known in the art. Examples can be found, for instance, in the aforementioned U.S. patent application Ser. No. 13/601,110.

EXAMPLES

Example 1

A chemical agent paste was prepared by mixing 1 gram of fumed silica (0.2-0.3 micrometers diameter), 5 grams of propylene glycol, and 1 drop of a solution containing 1.0 molar elemental iodine in 1.0 molar potassium iodide. The paste was applied by brush coating onto cadmium telluride samples. The coated samples were heated on a hot plate for 2 minutes, and then the paste was removed with a water rinse. The paste did not lose its ability to wet the surface of the samples as the exposure occurred, in contrast to behavior observed for aqueous compositions. The paste remained orange colored, indicating that iodine was present throughout the exposure. A tellurium-enriched region was observed to form on the exposed area of the samples.

Example 2

Thin film photovoltaic devices were fabricated using cadmium telluride (CdTe) as the absorber layer. The CdTe layer of the devices, after deposition, were treated with a paste chemical agent made by mixing 8 grams of fumed silica, 50 grams of propylene glycol, and 0.5 ml of iodine solution (1.0 moles/liter potassium iodide plus 0.5 moles/liter elemental iodine). Various devices were respectively subjected to one of several time-temperature combinations, with times ranging from 2 minutes to 20 minutes and temperatures ranging from 65 degrees Celsius to 150 degrees Celsius. A control group was treated using an immersion process in an aqueous iodine solution. After treatment with the iodine-containing chemical agent, fabrication of the devices was completed and then the resultant devices were tested in highly accelerated life tests (HALT). Several of the experimentally processed devices exhibited comparable performance to that of the control devices. Devices made with shorter exposure times and lower temperatures tended to have decreased open circuit voltage during HALT. Devices made with longer exposure times tended to show decreased open circuit resistance during HALT. In this particular example, the devices with best overall behavior were those treated for 5 minutes-10 minutes at 65 degrees Celsius.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for treating a semiconductor material, comprising:
   contacting at least a portion of the semiconductor material with a chemical agent, the semiconductor material comprising a chalcogenide;
   wherein the chemical agent comprises
      a solvent, and
      an iodophor dissolved in the solvent.

2. The method of claim 1, wherein the chemical agent comprises an iodophor selected from the group consisting of polyvinyl pyrrolidone:iodine, polyethoxy polypropoxyethanol:iodine, the nonyl phenyl ether of polyethylene glycol:iodine, and combinations thereof.

3. The method of claim 1, wherein the chemical agent comprises an iodophor selected from the group consisting of ethylene glycol:iodine, propylene glycol:iodine, glycerine:iodine, and combinations thereof.

4. The method of claim 1, wherein the chemical agent comprises 0.01 to 1% total iodine.

5. The method of claim 1, wherein the chemical agent further comprises copper, silver, or gold.

6. The method of claim 1, wherein the solvent comprises ethylene glycol, propylene glycol, glycerol, or combinations thereof.

7. The method of claim 1, wherein the chemical agent further comprises a thickener.

8. The method of claim 7, wherein the thickener comprises an inorganic material.

9. The method of claim 8, wherein the inorganic material comprises aluminum oxide, fumed silica, or combinations thereof.

10. The method of claim 8, wherein the thickener comprises an organic material.

11. The method of claim 10, wherein the organic material comprises polyvinyl pyrrolidone, polyvinyl alcohol, or combinations thereof.

12. The method of claim 1, wherein contacting comprises contacting at least a portion of the semiconductor material with a paste, the paste comprising the chemical agent.

13. The method of claim 1, wherein contacting comprises contacting at least a portion of the semiconductor material with a liquid, the liquid comprising the chemical agent.

14. The method of claim 1, further comprising heating the semiconductor material to a temperature of at least about 45 degrees Celsius.

15. The method of claim 1, further comprising heating the semiconductor material to a temperature of at least about 65 degrees Celsius.

16. The method of claim 1, wherein the chalcogenide comprises tellurium, selenium, or a combination thereof.

17. The method of claim 1, wherein the semiconductor material comprises cadmium telluride.

18. The method of claim 1, wherein the chemical agent is substantially free of copper.

19. The method of claim 1, further comprising removing the chemical agent from the semiconductor material, and then contacting at least a portion of the semiconductor material with a contacting composition comprising a dopant.

20. The method of claim 19, wherein the dopant comprises copper, silver, gold, or combinations thereof.

21. The method of claim 20, wherein the dopant is present in the contacting composition at a concentration of less than about 10 parts per million.

22. The method of claim 21, wherein the concentration of the dopant is in a range from about 10 parts per billion to about 1000 parts per billion.

23. The method of claim 1, further comprising contacting at least a portion of the semiconductor material with a passivating agent.

24. The method of claim 23, wherein the passivating agent comprises cadmium chloride.

25. The method of claim 1, further comprising introducing a dopant into the semiconducting material.

26. The method of claim 25, wherein the introducing step is performed prior to the contacting step.

27. The method of claim 25, wherein introducing the dopant comprises contacting at least a portion of the semiconductor material with a metal salt solution comprising the dopant.

28. The method of claim 1, further comprising disposing a layer comprising the semiconductor material on a support prior to the contacting step.

29. A method for treating a semiconductor material, comprising:
(a) contacting at least a portion of the semiconductor material with a passivating agent, wherein the semiconductor material comprises a chalcogenide;
(b) forming a first region in the semiconductor material by introducing a dopant into the semiconductor material;
(c) forming a chalcogen-rich region; and
(d) forming a second region in the semiconductor material, the second region comprising a dopant, wherein an average atomic concentration of the dopant in the second region is greater than an average atomic concentration of the dopant in the first region, and
wherein step (c) comprises
contacting at least a portion of the semiconductor material with a chemical agent; wherein the chemical agent comprises a solvent, and an iodophor dissolved in the solvent.

* * * * *